United States Patent [19]

Ransom et al.

[11] 4,280,212

[45] Jul. 21, 1981

[54] MULTIPLEXING SYSTEM FOR A SOLID STATE TIMING DEVICE

[75] Inventors: Stephen A. Ransom, Huntingdon Valley; Jere W. Hohmann, Doylestown; Clement Nahmias, Ardmore, all of Pa.

[73] Assignee: Solid State Scientific, Inc., Montgomeryville, Pa.

[21] Appl. No.: 66,636

[22] Filed: Aug. 15, 1979

[51] Int. Cl.[3] .................... G04C 19/00; H03K 3/01; G08B 5/22

[52] U.S. Cl. .................................. 368/82; 307/270; 340/802

[58] Field of Search .................... 58/4 A, 23 R, 23 A, 58/50 R, 152 R; 340/789, 802; 350/332; 307/262, 270; 364/705, 710; 178/50; 179/15 A

[56] References Cited

U.S. PATENT DOCUMENTS

| | | | |
|---|---|---|---|
| 3,961,472 | 6/1976 | Biehl | 58/4 A |
| 4,019,178 | 4/1977 | Hashimoso et al. | 350/332 |
| 4,024,512 | 5/1977 | Amelio et al. | 307/270 |
| 4,063,409 | 12/1977 | Batliss | 58/23 R |
| 4,083,175 | 4/1978 | Petropoulos et al. | 58/4 A |
| 4,084,402 | 4/1978 | Moyer | 58/23 R |
| 4,121,203 | 10/1978 | Edwards et al. | 340/802 |

*Primary Examiner*—Vit W. Miska
*Attorney, Agent, or Firm*—Allan Ratner

[57] ABSTRACT

A CMOS timing device having a primary oscillatory reference source, a chain of series connected bistable divider stages whose data outputs are applied to a decoder/display by way of a multiplexing network. The multiplexing network is comprised of a plurality of multiplex sections, each section having a plurality of data transmission channels or paths. Each channel includes a plurality of MOS devices of a first type connected to a common bus. All channels driving the common bus share a single MOS device of a second type which provides a complementary function with respect to the first type to establish predetermined operating voltage levels for the data logic states carried by the common bus. The data on the common bus of each multiplex section is stored in a CMOS bistable latching type flip-flop whose regenerative feedback path is MOS device controlled.

10 Claims, 5 Drawing Figures

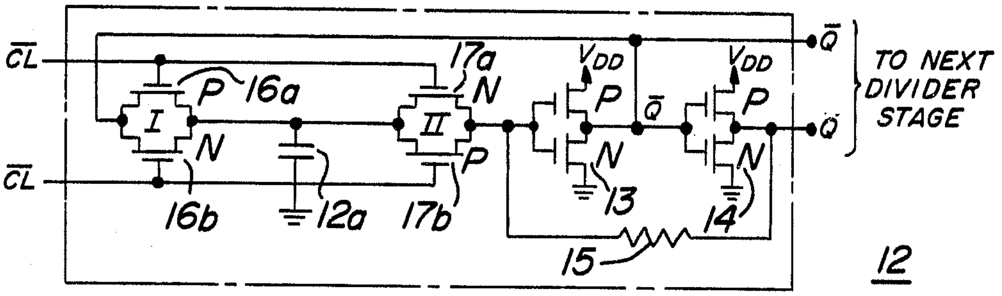
FIG. 3
FIG. 5
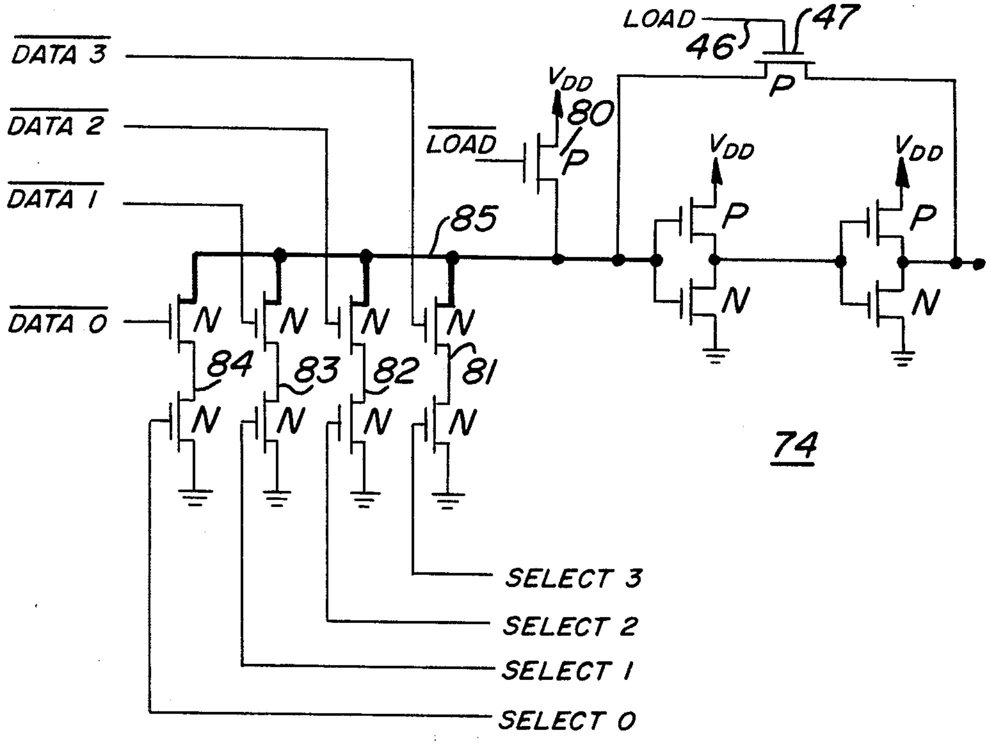

MULTIPLEXING SYSTEM FOR A SOLID STATE TIMING DEVICE

BACKGROUND OF THE INVENTION

A. Field of the Invention

This invention relates to the field of electronic solid state timing devices.

B. Prior Art

Electronic solid state timing devices are well known which have a high frequency clock source providing a timing reference signal which excites a chain of series connected counters. The first counter of such a series chain divides the high frequency clock reference so as to provide a 1 Hz signal. This signal then drives a divide-by-60 counter to count minutes, followed by a divide-by-12 counter to count hours, followed by serially connected counters to count days and months. Each of these binary counters contains timing intelligence data which must be conveyed to a mode-shared display capable of being commanded to display alternately the day and month or upon receipt of an alternative control command, to display hours and minutes on the same display means. Such display means are normally of the LED or LCD type.

The application of this timing data from the counter elements to a decoder and display is normally accomplished by some means of solid state switching or multiplexing. In the prior art of CMOS multiplexing technology, four CMOS devices, namely two P-channel transistors and two N- channel transistors were used to channel each timing data signal, as a function of the applied control command signals, to the responding display means. In the timing chains of counters, each timing parameter (seconds, minutes, hours, days, months, etc) has been processed using four to six binary digits thereby constituting a plurality of approximately 30 data signals required to be routed and translated to decimal format. Each signal has required a multiplexer transmission gate to permit or inhibit transmission of the data from the counter elements to the decoder input terminals. Each of these transmission gates has been individually activated by control signals. Therefore, the increased complexity of each individual transmission gate incurs a serious penalty in terms of integrated circuit area required to accommodate the necessary transistors and the associated bussing structure and fabrication of capacitance essential to proper counting chain operation.

The complexity of the multiplexing topology exhibited in the CMOS prior art introduces severe penalties in terms of the large magnitude of devices required to perform the necessary counting, data signal routing, switching the heavy plurality of metalization paths in the bussing structure and the excessive quiescent power required for operation and display update. In addition, the prior multiplexer art has required the introduction of a plurality of guard bands between P-channel transistor and N-channel transistor devices to provide electrical isolation. Substantial chip area is thereby required with subsequent performance penalties in other operational modes.

An object of the present invention is a multiplexer which provides 50% hardware savings as compared to the prior art with significant improvements in the reduction of and utilization of chip area, reduced quiescent power drain, ease of fabrication, simplicity of operation and improved overall device reliability.

SUMMARY OF THE INVENTION

A solid state timing device having a chain of counters for displaying time information on a display which comprises a decoder for operating the display. The counters are coupled to the decoder by multiplexing means which is made up of a plurality of multiplex sections. Each multiplex section includes a common bus having a plurality of data transmission channels where each channel is formed of a plurality of MOS devices of only a first type. A complementary MOS device of a second type is coupled to the common bus and provides a complementary function with respect to the first type of MOS devices. In this manner the complementary MOS device establishes predetermined operating voltage levels of the bus for the logic states.

BRIEF DESCRIPTION OF THE DRAWINGS

FIG. 3 shows in more detail the CMOS devices forming each flip-flop counting stage in FIGS. 1, 2;

FIG. 5 illustrates a further embodiment of one of the multiplexer sections of FIG. 2 comprising four channels and associated latch flip-flop.

DETAILED DESCRIPTION

Figure 1:
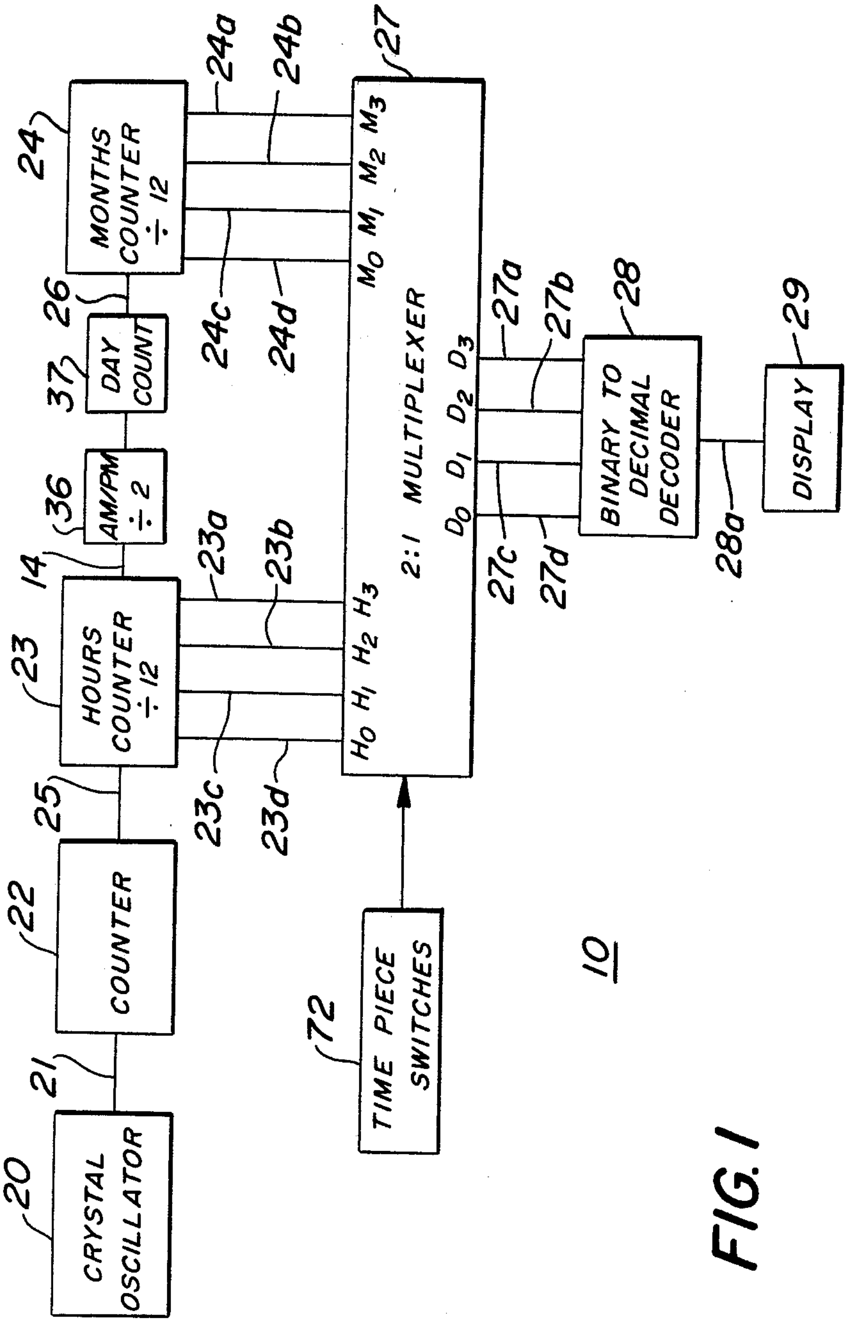
FIG. 1 illustrates in block diagram form timing device circuitry embodying the invention.

Referring to FIG. 1, a general block diagram of a solid state timing device 10 is shown. A crystal oscillator 20 provides a timing reference signal on line 21 which drives a counter chain comprised of counter 22, hours counter 23, AM/PM counter 36, day counter 37 and months counter 24. Counters 23,24 are divide by 12 counters and AM/PM counter 36 is a divide by two counter. The individual bistable binary flip-flops 12 which collectively perform the timing function are shown in FIG. 3. The signal on line 25 driving hours counter 23 is of repetition frequency of 1 cycle/hour. Similarly, the signal on line 26 driving months counter 24 is of repetition frequency of 1 cycle/month.

Counters 23 and 24, each are comprised of four flip-flops 12 which provide timing data signals on lines 23*a*–*d* and 24*a*–*d* respectively and are applied to a 2:1 multiplexer 27. Upon application of data selection commands from conventional timepiece switches 72, CMOS data transmission gates or channels within multiplexer 27 are activated to route either the hours or months data to a conventional binary to decimal decoder 28 by way of an eight wire bus 28*a*. Display 29 may be of the LCD type and presents to the observer a numeric quantity ranging from 0 to 12.

FIG. 3 shows the CMOS bistable flip-flop circuit which performs the elemental (÷ by 2) counting fuction, the plurality of which comprise the counting chain 22, 23, 36, 37 and 24 of FIG. 1. This circuit is comprised of storage capacitor 12*a*, a CMOS first inverter 13, a CMOS second inverter 14, feedback resistor 15 which provides a positive feedback latching function and switches 16*a*–*b*, 17*a*–*b* which are alternately open or closed each half period of the input waveform CL, $\overline{CL}$. The divide-by-two output is provided by signals Q, Q. Details of circuit operation are given in U.S. Pat. No. 4,124,807.

Figure 4:
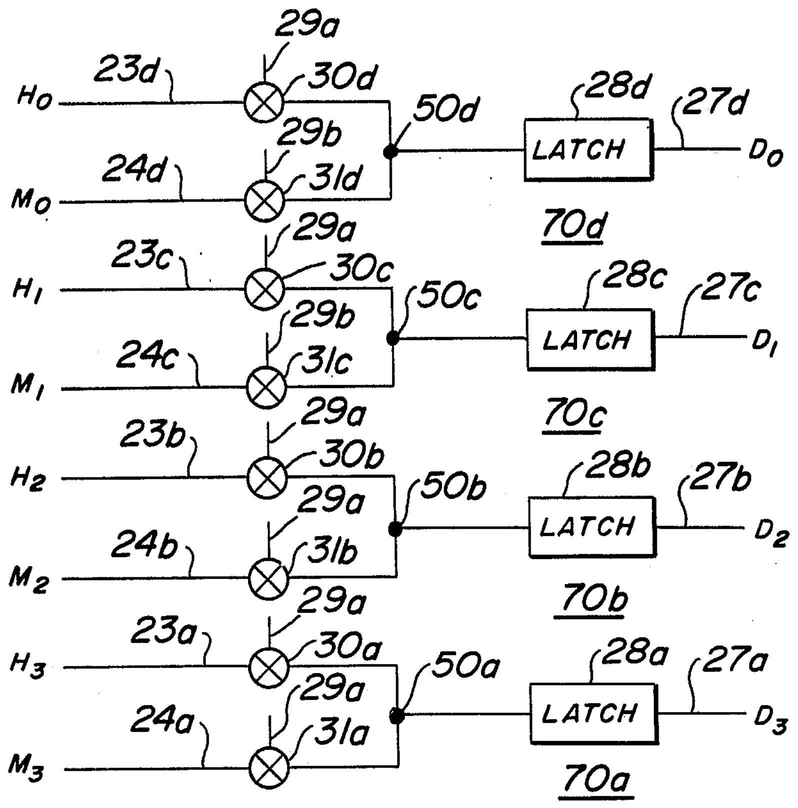
FIG. 4 is a functional block diagram of the four section multiplexer of FIG. 2 for selection and transmission of four binary timing data digits.

FIG. 4 is a functional block diagram of the circuitry within 2:1 multiplexer 27 comprising four sections 70*a–d* in which two groups of signals are switchable onto output lines 27*a–d*. In sections 70*a–d*, respective data transmission channels or gates 30*a–d* permit transmission of hours timing data bits on lines 23*a–d* respectively through common bus lines 50*a–d* to the latching flip-flops 28*a–d* for temporary storage. Transmission channels 31*a–d* similarly permit transmission through bus lines 50*a–d* of month timing data and subsequent storage. Select signals on lines 29*a–b* which never operate simultaneously, provide actuation of channels 30*a–d* and 31*a–d* respectively.

Figure 2:
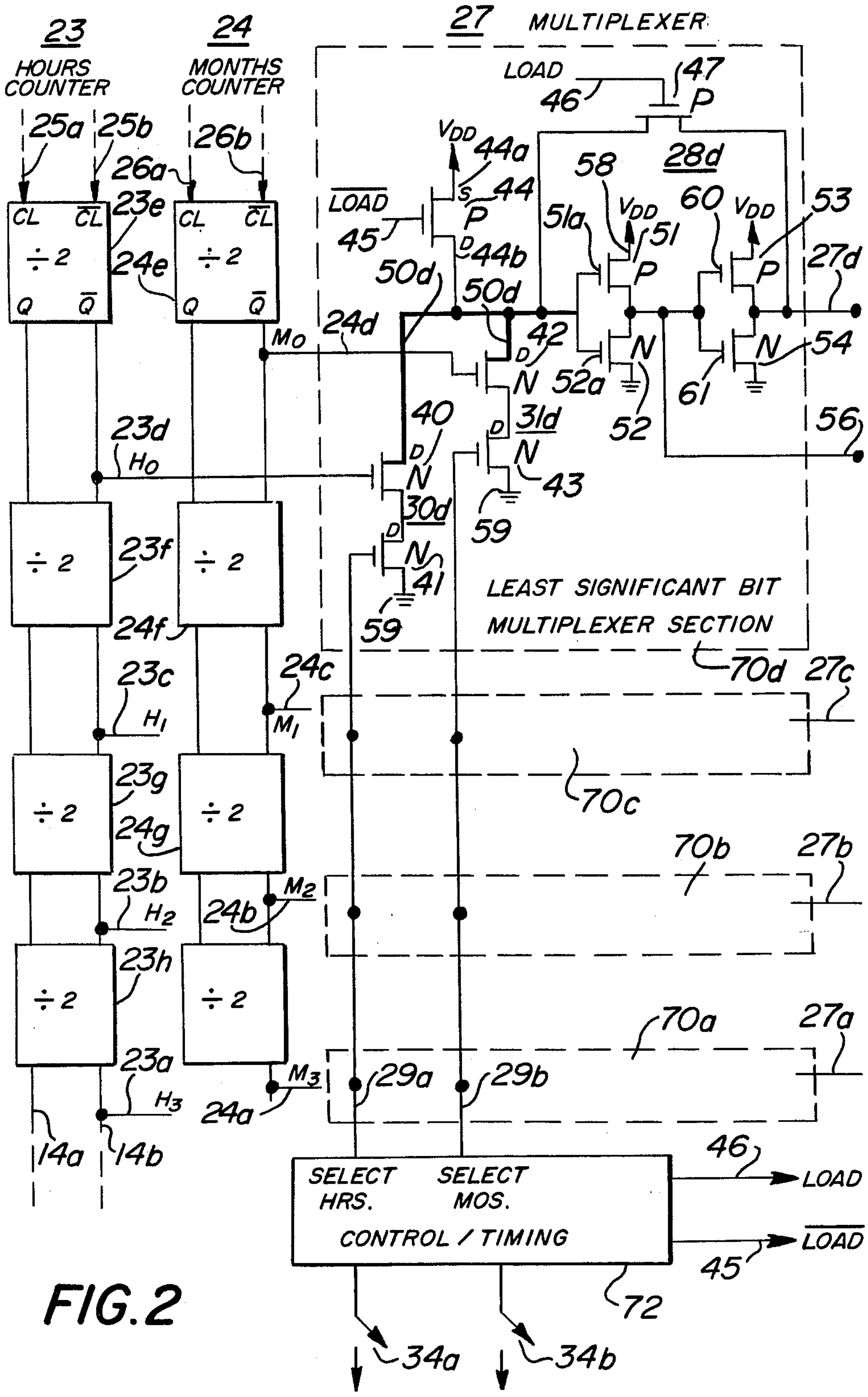
FIG. 2 shows in more detail one of the two channel multiplexing sections, the associated latch flip-flop necessary for data storage and the individual divide-by-two stages for "hours" and "months" data of FIG. 1.

For purposes of simplicity, FIG. 2 shows only the detail of multiplexer section 70*d* which is coupled to least significant bit dividers 23*e*, 24*e* of counters 23 and 24. It will be understood that the remaining sections 70*a–c* are similar. In section 70*d*, channel 30*d* comprises CMOS N-channel transistors 40, 41 and channel 31*d* comprises N-channel CMOS transistors 42,43. As shown, respective transistors 40,41 and 42,43 are connected in series to form each channel with the source terminals of transistors 41,43 coupled to ground and the drains of these transistors coupled to the sources of transistors 40,42, respectively. The drains of transistors 40, 42 are coupled to bus 50*d*. A "pull-up" P-channel transistor 44 complementary to the N-channel transistors 40,41; 42,43 has its drain 44*b* coupled to bus 50*d* and its source 44*a* coupled to $V_{DD}$.

Further latch 28*d* comprises conventional complementary CMOS transistor pairs 51,52; 53,54. To display hours, select switch 34*a* is closed and switch 34*b* is open to produce through conventional timepiece control logic, a logic 1 (high) on line 29*a*. As a result, N-channel CMOS transistor switch 41 of channel 30*d* is turned on permitting the transmission of data from hours flip-flop 23*e*. At the same time, switches 72 produces a low on line 29*b*, turning off transistor 43 thereby preventing the transmission and display of months data from channel 31*d*. If the Q output on line 23*d* of flip-flop 23*e* is high, N-channel transistor 40 will in addition be turned on thereby presenting a low (logic 0) at common bus 50*d*. During the no load time when data is not being loaded into latch 28*d*, signal LOAD on line 46 is low and LOAD on line 45 is high. With high LOAD applied to gate lead of P-channel transistor 44, this transistor 44 is maintained in the OFF state thereby presenting an open circuit between supply potential $V_{DD}$ 58 and common bus 50*d*. With low LOAD applied to transistor 47, this transistor is turned on thereby latching line 27*d* to bus 50*d*.

At load time, when data from the counters is desired to be transferred into the storage latch flip-flop 28*d* comprised of inverters 51,52 and 53,54 and the associated feedback path transistor 47, the signal LOAD is pulsed momentarily high thereby open-circuiting the feedback path through transistor 87 from output terminal 27*d* to bus 50*d*. Concurrently at load time, the signal LOAD is pulsed low (for a very short duty cycle) at gate 45 causing P-channel transistor 44 to turn on and act as a low impedance pull-up resistor between bus 50*d* and $V_{DD}$. Since the assumed state of 23*e* was a logic 1, line 23*d* will be high and both N-channel transistors 40 and 41 will be conducting (all devices of channel 30*d*) thereby pulling bus 50*d* towards ground potential 59 or in the range of 10 to 50 millivolts. This potential turns off latch N-channel transistor 52 and turns on P-channel transistor 51 thereby placing latch output terminal 56 at approximately $V_{DD}$ potential 58. This $V_{DD}$ potential is then applied to gates 60 and 61 of P-channel transistor 53 and N-channel transistor 54 respectively thereby causing transistor 54 to turn on and transistor 53 to turn off causing a low (near ground potential) at lead 27*d*. In this manner, timing data has now been transferred to latch 28*d*.

The very short duty cycle LOAD pulse (less than 0.1%) is now returned to the low (logic 0) state causing P-channel transistor 47 to conduct thereby connecting latch output 27*d* to the latch input 50*d*. This action causes maintenance of the state of the latch during load time. Concurrently, the signal LOAD returns to the high level thereby open-circuiting P-channel transistor 44 and terminating its role as a low value pull-up resistor.

The action of multiplex section 70*d* is changed when the data on line 23*d* is in the opposite state from that described above with the state of flip-flop 23*e* now a logic 0. Selector N-channel transistor 41 is again assumed to be in the on state by an associated control signal which is high on line 29*a*. Since the gate of N-channel transistor 40 is at ground potential or 0 volts, transistor 40 will be in the non-conductive state. Thus less than all devices of channel 30*d* are turned on. As a result, at load time, when P-channel transistor 44 is turned on, supply potential $V_{DD}$ will be transferred to bus 50*d* with virtually no IR drop from source terminal 44*a* to the drain terminal 44*b* of P-channel transistor 44.

Feedback P-channel transistor 47 has been turned off by way of LOAD being high and applied to the gate lead 46 of this device. Similarly, the gates 51*a*, 52*a* of transistors 51 and 52 respectively present a gate input impedance of thousands of megohms. In consequence, a logic 1 ($V_{DD}$) is applied on the gates of the first inverter 51,52 to yield a logic 0 at terminal 56. This state is inverted through the action of the second inverter 53,54 to cause a logic 1 at terminal 27*d*. Upon return of the LOAD signal on line 46 to the low state, P-channel transistor 47 conducts once again providing a low impedance path from latch output 27*d* to latch input 50*d*. The high voltage state at terminal 27*d* is therefore applied to the gates of the first inverter 51,52 permitting the logic 0 data state of flip-flop 23*e* to be stored.

The operation of multiplexing section 70*d* is similar to that described above when months timing data is to be taken from the months counter. In this case, the hours transmission path through transistor 40 is rendered inactive by way of the inactive state of lead 29*a* thereby causing N-channel transistor 41 to be nonconductive. On the other hand, lead 29*b* is placed in the high state, permitting N-channel transistor 43 to conduct and allowing transmission of data through N-channel transistor 42 in a manner similar to that discussed above.

Important advantages and performance gains result from using the circuit topology of multiplexer section 70*d* shown in FIG. 2. A major reduction in required device area is obtained by using only two N-channel devices per gate when contrasted to the prior art which required two N-channel devices plus two P-channel devices per gate to accomplish the same function. It will be understood that this savings of 50% in transistor device count is in an area where a high plurality of devices are used. For example, in the example of FIG.

2, section **70*d* uses four N-channel transistors to gate the least significant bits of counters 23 and 24 to bus 50. In addition, each of the remaining sections 70*a*–*c* also uses four N-channel transistors for a total of 16 N-channel transistors. It will be understood however, that a timepiece normally has a full display not only of hours and months as shown in FIG. 2 but may also have display of: (1) hundreds of seconds; (2) tenths of seconds; (3) seconds; (4) minutes; (5) days. Thus, in an example of a full display, a total of 74 devices may be required. Prior art circuit topology would have required a total of 148 devices to perform similar switching and routing function in the multiplexer sections of the solid state timing device 27 of FIG. 1**.

Equally important in the practical realization of watch circuits is the steady-state consumption of power. The embodiment of CMOS devices shown in FIG. 2 is particularly advantageous with respect to its extremely minimal consumption of power at all periods of operation including display update. The use of flip-flop 12 of FIG. 3 as described in detail in U.S. Pat. No. 4,124,807 results in a significant savings of CMOS transistors per bistable element. This savings is multiplied by a factor of approximately 50 since the length of the counter chain may involve as many as 50 divide-by-two stages.

A significant power savings is also realized by multiplexer sections **70*a*–*d*. The first factor contributing to this power consumption savings is the significant reduction in the quantity of devices as previously discussed. Secondly, in the information update, a latching type flip-flop 28*d* is used which is pulsed for a period whose duration is a very small percentage, e.g. $<<1\%$, of the total duty cycle. At all other times, the multiplexer switching transistors are consuming virtually zero quiescent power. Thus, the overall average power consumption is negligible. Further, the P-channel pull-up device 44** draws current in performing its pull-up role for the short duty cycle period when LOAD is pulsed low.

An additional important advantage relating to structural fabrication involves capacitor **12*a* of flip-flop 12, FIG. 3. As described in U.S. Pat. No. 4,124,807, capacitor 12*a* performs a critical performance role. A relatively large capacitance is required for superior performance of the flip-flop. This capacitance is achieved by way of using gate oxide capacitance and also junction capacitance. Use has also been made of the areas under the metalizations associated with the multiplexer bus 50*d*, and lines 23*d*, 24*d* and corresponding busses and lines of the other multiplexer sections and in counters 23,24**. The more efficient multiplexer topology and circuitry employing a 50% reduction of transistor devices/leg has yielded substantial gains in available chip area thereby providing sufficient space to allow passage of the metal lines associated with the complex bussing structure. In the prior art of P-channel and N-channel devices, in each multiplexer leg, there has been required substantially more contacts to these devices. In addition, fairly large separations in the guard bands between the P wells which contained the N-channel transistors and the P-channel transistors had to be employed with the net result of a severe penalty in terms of available chip area. The use of devices of all one type in each leg eliminates the necessity for these guard bands, thereby yielding substantial net savings in area.

Another embodiment of the multiplexer section **70*d* is shown in FIG. 5 as section 74. Thus, a four channel multiplexer section 74 is comprised of N-channel transistor pairs 81,82,83,84 tied to a common bus 85 and a complementary pull-up P-channel transistor 80. It will be understood that section 74** is not limited to four channels but could be extended indefinitely since only a single leg or channel is operative at any given time. Limitations on the totality of channels would be influenced by device and bus capacitance (stray) and related speed of transmission requirements associated with the data being routed through the multiplexer.

What is claimed is:

1. A solid state timing device having a chain of counters for displaying time information on a display comprising decoder means for operating said display, multiplexing means for coupling selected counters to said decoder means, said multiplex means having a plurality of multiplex sections, each multiplex section including a common bus having a plurality of data transmission channels, a plurality of MOS devices of only a first type forming each of said channels, a complementary MOS device of a second type coupled to said common bus providing a complementary function with respect to said first type of MOS devices to establish predetermined operating voltage levels of the bus for the logic states, means providing each multiplex section a first reference potential coupled to each of said channels and a second reference potential coupled to said complementary MOS device whereby said complementary MOS device operates as a low impedance pull-up resistor between said common bus and said second reference potential, and signalling means having a substantially short duty cycle coupled to a switching terminal of said complementary MOS device of each multiplex section for turning on said device and establishing for a substantially short period of time a predetermined operating voltage level on said common bus of substantially (1) said first reference potential when all the MOS devices of any channel are turned on and (2) said second reference potential when less than all the MOS devices of any channel are turned on.

2. A solid state timing device having a chain of counters for displaying time information on a display comprising decoder means for operating said display, multiplexing means for coupling selected counters to said decoder means, said multiplex means having a plurality of multiplex sections, each multiplex section including a common bus having a plurality of data transmission channels, a plurality of MOS devices of only a first type forming each of said channels, and a complementary MOS device of a second type coupled to said common bus providing a complementary function with respect to said first type of MOS devices to establish predetermined operating voltage levels of the bus for the logic states, each multiplex section including bistable latching means coupled between said common bus and said decoder means, and means providing for each multiplex section a first reference potential coupled to each of said channels and a second reference potential coupled to said complementary MOS device whereby said complementary MOS device operates as a low impedance pull-up resistor between said common bus and said second reference potential.

3. The solid state timing device of claim 2 in which there is provided means having a substantially short duty cycle coupled to said complementary MOS device of each multiplex section for turning on said device and establishing for a substantially short period of time a predetermined operating voltage level on said common bus of substantially (1) said first reference potential when all the MOS devices of any channel are turned on and (2) said second reference potential when less than all the MOS devices of any channel are turned on.

4. The solid state timing device of claims 1 or 2 in which each of said counters is coupled to a selected one of said first type MOS devices.

5. The solid state timing device of claim 4 in which for each channel said plurality of first type MOS devices are N-channel MOS transistors connected in series between said common bus and said first reference potential.

6. The solid state timing device of claim 5 in which there is provided only two N-channel MOS transistors for each channel.

7. The solid state timing device of claim 5 in which for each multiplex section said complementary MOS device of a second type comprises a single MOS device.

8. The solid state timing device of claim 5 in which for each multiplex section said complementary MOS device of a second type is a single P-channel MOS transistor coupled between said common bus and said second reference potential.

9. The solid state timing device of claim 2 in which each of said latching means includes at least one CMOS inverter having a P-channel transistor and an N-channel transistor.

10. The solid state timing device of claim 9 in which each of said latching flip-flops includes an additional CMOS inverter coupled to said one CMOS inverter and in which there is provided positive feedback means including a switching device coupling an output of said second inverter to an input of said first inverter.

* * * * *